United States Patent
Callahan, Jr.

(10) Patent No.: US 8,248,747 B2
(45) Date of Patent: Aug. 21, 2012

(54) PROTECTION FOR BI-DIRECTIONAL SWITCH

(75) Inventor: Michael James Callahan, Jr., Austin, TX (US)

(73) Assignee: STMicroelectronics Co., Inc., Carrollton, TX (US)

( * ) Notice: Subject to any disclaimer, the term of this patent is extended or adjusted under 35 U.S.C. 154(b) by 404 days.

(21) Appl. No.: 12/627,729

(22) Filed: Nov. 30, 2009

(65) Prior Publication Data

US 2010/0165527 A1 Jul. 1, 2010

Related U.S. Application Data

(60) Provisional application No. 61/203,978, filed on Dec. 31, 2008.

(51) Int. Cl.
- *H02H 3/08* (2006.01)
- *H02H 9/02* (2006.01)

(52) U.S. Cl. ..................................... 361/93.1
(58) Field of Classification Search .................... 361/23, 361/93.1
See application file for complete search history.

(56) References Cited

U.S. PATENT DOCUMENTS

| | | | |
|---|---|---|---|
| 6,975,122 B2 * | 12/2005 | Gonthier et al. | 324/522 |
| 7,675,727 B2 * | 3/2010 | Sasaki et al. | 361/93.1 |
| 2009/0160476 A1 * | 6/2009 | Omaru | 324/765 |

FOREIGN PATENT DOCUMENTS

| | | | |
|---|---|---|---|
| JP | 2000002724 A | * | 1/2000 |
| JP | 2001165966 A | * | 6/2001 |

OTHER PUBLICATIONS

Abstract for JP 2000002724 A. Jan. 7, 2000.*
Abstract for JP 2001165966 A. Jun. 22, 2001.*

* cited by examiner

*Primary Examiner* — Rexford Barnie
*Assistant Examiner* — Christopher Clark

(57) ABSTRACT

A bi-directional protection circuit employs a single comparator for detecting fault conditions. Diodes are coupled between a detection node and voltage dividers setting references for inverting and non-inverting comparator inputs, each diode forward biased during one of the positive and negative halves of the alternating current input signal cycle and coupling the detection node to a respective one of the inverting and non-inverting comparator inputs, and reverse biased during the other of the positive and negative halves and decoupling the detection node from the other of the inverting and non-inverting comparator inputs. Upon an overcurrent condition during the positive half, a voltage at the inverting comparator input is drawn above the reference voltage at the non-inverting input. Upon an overcurrent condition during the negative half, a voltage at the non-inverting comparator input is drawn below the reference voltage at the inverting input.

20 Claims, 1 Drawing Sheet

PROTECTION FOR BI-DIRECTIONAL SWITCH

CROSS-REFERENCE TO RELATED APPLICATION(S) AND CLAIM OF PRIORITY

The present application is related to U.S. Provisional Patent Application No. 61/203,978, filed Dec. 31, 2008, entitled "PROTECTION FOR BI-DIRECTIONAL SWITCH." Provisional Patent Application No. 61/203,978 is assigned to the assignee of the present application and is hereby incorporated by reference into the present application as if fully set forth herein. The present application hereby claims priority under 35 U.S.C. §119(e) to U.S. Provisional Patent Application No. 61/203,978.

TECHNICAL FIELD

The present disclosure is directed, in general, to protection of switches, and more specifically, to the protection of a bidirectional switch upon occurrence of an overcurrent event such as a short-circuit in a load controlled in alternating current (AC) mode by the switch.

BACKGROUND

Circuit loads, particularly alternating current (ac) supplied bidirectional resistive elements in lighting or heating devices, can short-circuit during operation. In such cases, switches—particularly bidirectional switches—controlling such loads must be protected.

U.S. Pat. No. 6,975,122, the content of which is incorporated herein by reference, discloses one technique for protecting a bidirectional switch for ac loads. The voltage across the switch may be positive or negative with respect to ground. By attenuating this signal and adding a portion of the supply voltage Vdd, a positive voltage with respect to ground may be detected. While this design improves over prior designs in that only a single polarity power supply is required for the detection circuitry, two comparators are employed: one to detect a possible overcurrent fault in each half wave of the ac power supply.

There is, therefore, a need in the art for improved protection of bidirectional switches.

SUMMARY

A bi-directional protection circuit employs a single comparator for detecting fault conditions. Diodes are coupled between a detection node and voltage dividers setting references for inverting and non-inverting comparator inputs, each diode forward biased during one of the positive and negative halves of the alternating current input signal cycle and coupling the detection node to a respective one of the inverting and non-inverting comparator inputs, and reverse biased during the other of the positive and negative halves and decoupling the detection node from the other of the inverting and non-inverting comparator inputs. Upon an overcurrent condition during the positive half, a voltage at the inverting comparator input is drawn above the reference voltage at the non-inverting input. Upon an overcurrent condition during the negative half, a voltage at the non-inverting comparator input is drawn below the reference voltage at the inverting input.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose; be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
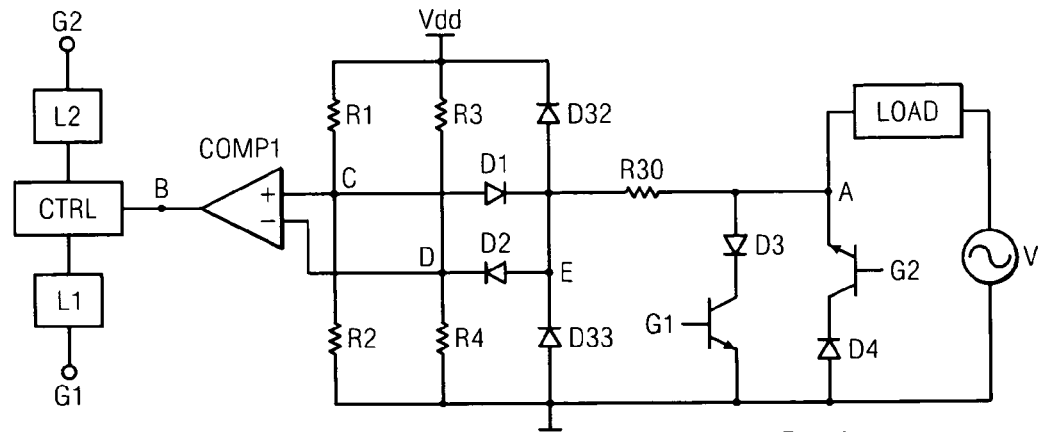
FIG. 1 is a schematic diagram of a bi-directional switch protection circuit using a single comparator in accordance with one embodiment of the present disclosure.
Figure 2A:
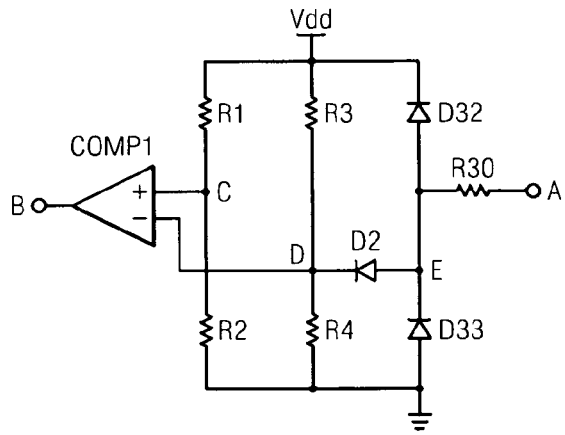
FIGS. 2A and 2B are partial equivalent schematics for the circuit of FIG. 1.
Figure 2B:
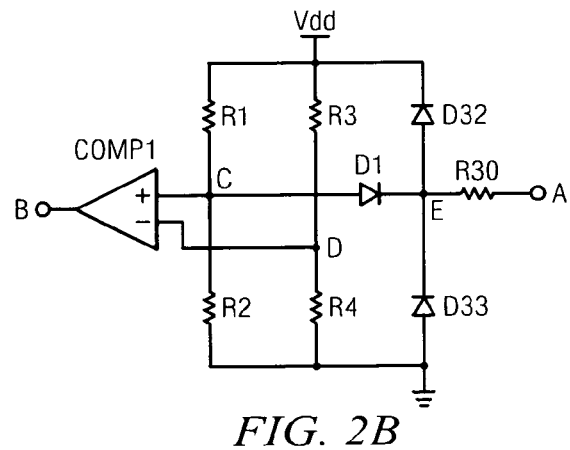
Figure 3:
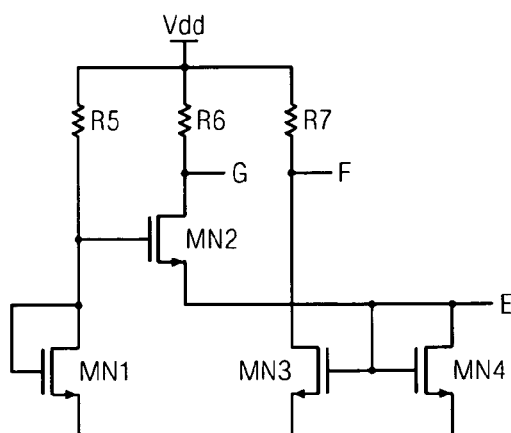
FIG. 3 is a simplified circuit diagram of a detector for determining in which half cycle the circuit of FIG. 1 is operating.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

FIG. 1 is a schematic diagram of a bi-directional switch protection circuit using a single comparator in accordance with one embodiment of the present disclosure. The same result described in U.S. Pat. No. 6,975,122 may be achieved with a single comparator, consequently requiring a smaller amount of silicon to implement. This reduction in complexity may be achieved by recognizing that only one comparator has to operate at a time. However, the situation is complicated because, during one half cycle, the comparison is made when the inverting comparator input goes more positive than the other input while, during the other half cycle, the comparison is made when the voltage on the non-inverting input goes below the other input.

In the exemplary embodiment of FIG. 1, an alternating current voltage source V is connected between a load LOAD and ground. A node A also connected to the load LOAD is connected to ground by two parallel branches, each including an insulated gate bipolar junction transistor (IGBT) and a diode D3 or D4. The emitter of one IGBT is connected to node A, the gate to a control signal G2, and the collector to the cathode of diode D4, with the anode of diode D4 connected to ground. The anode of diode D3 is connected to node A, cathode of diode D3 is connected to the collector of the other IGBT, with the gate of the other TORT connected to a control signal G1 and the emitter connected to ground. During normal operation, the control signals G1 and G2 are set to allow the two IGBTs to conduct, completing the circuit loop with voltage supply V and load LOAD. When an overcurrent condition is signaled by comparator COMP1, the control signals G1 and G2 are set so that the two IGBTs do not conduct, interrupting the circuit loop and stopping delivery of power to load LOAD.

A resistor R30 is connected between node A and node E, the common connection between two series-connected diodes D32 and D33. The cathode of diode D32 is connected to a direct current (DC) power supply voltage Vdd, while the anode is connected to node E. The cathode of diode D33 is connected to node E, while the anode is connected to ground. Node E is connected to node C by a diode D1, with the cathode connected to node E and the anode connected to node C. Node E is also connected to node D by a diode D2, with the anode connected to node E and the cathode connected to node D. A resistor R1 is connected between the power supply voltage Vdd and node C, and a resistor R2 is connected between node C and ground. A resistor R3 is connected between the power supply voltage Vdd and node D, and a resistor R4 is connected between node D and ground.

Node C is connected to the positive (non-inverting) input of comparator COMP1, while node D is connected to the negative (inverting) input. The output of comparator COMP1 is node B, connected to control logic CTRL, which in turn is connected to latches L1 and L2 from which control signals G1 and G2 are taken.

FIGS. 2A and 2B are partial equivalent schematics for the circuit of FIG. 1. FIG. 2A represents the portion of the circuit of FIG. 1 that is active during a positive half wave (that is, when a positive voltage with respect to ground is present at node A). In this mode, diode D1 is reverse biased, and so consequently is for simplicity omitted from the drawing. The reference for the non-inverting input of the comparator COMP1 is node C, and is produced by a voltage divider determined by the resistance values of resistors R1 and R2. When node A goes positive during an overcurrent event, diode D2 forward biases and takes node D above node C. As a result, the comparator COMP1 output switches low, indicating an overcurrent fault condition.

FIG. 2B represents the portion of the circuit of FIG. 1 that is active during a negative half wave (that is, when node A is negative with respect to ground). In such a circumstance, diode D2 is reverse biased and so consequently is for simplicity omitted from the drawing. The reference in this case is the inverting input of the comparator at node D, and is determined by the resistance values of resistors R3 and R4. When node A goes negative during an overcurrent event, diode D1 forward biases and takes node C below reference node D. As a result, the comparator COMP1 output switches low, indicating an overcurrent fault condition.

It should be noted that since the maximum voltage across diodes D1 and D2 is constrained to the supply voltage Vdd, inexpensive low-voltage diodes may be used. Diodes D1 and D2 may be normal diodes, Schottky diodes, or diodes made from integrated transistors, or may be replaced by synchronous rectifiers and used in combination with a detector to allow the circuit to resolve which half cycle the circuit is operating in at a given point in time. Numerous such circuits can detect whether the voltage at node A is positive or negative with respect to ground.

FIG. 3 is a simplified circuit diagram of a detector for determining in which half cycle the circuit of FIG. 1 is operating. Resistor R5 is connected between power supply voltage Vdd and the gate and drain of n-channel metal oxide semiconductor field effect transistor (MOSFET) MN1, which are connected to the gate of transistor MN2. The source of transistor MN1 is connected to ground. Resistor R6 is connected between power supply voltage Vdd and node G, at the drain of transistor MN2. The source of transistor MN2 is connected to node E, at the drain of transistor MN4. Resistor R7 is connected between power supply voltage Vdd and node F, at the drain of transistor MN3. The gates of transistors MN3 and MN4 are connected to node E, and the sources of transistors MN3 and MN4 are connected to ground.

Within the detector circuit of FIG. 3, transistors MN3 and MN4 are active in the positive half cycle, allowing node F to fall. Transistors MN1 and MN2 are active in the negative half cycle, allowing node G to fall. Nodes F and G may be coupled through appropriate drive circuitry and logic to control the synchronous rectifiers mentioned above.

The protection circuit described above utilizes a single comparator to protect a bi-directional load. Less silicon area, and thus less expense, is therefore required.

Although the above description is made in connection with specific exemplary embodiments, various changes and modifications will be apparent to and/or suggested by the present disclosure to those skilled in the art. It is intended that the present disclosure encompass all such changes and modifications as fall within the scope of the appended claims.

What is claimed is:

1. A protection circuit, comprising:
    a comparator;
    a first diode connected to be forward biased during a positive half of an alternating current input signal cycle and to create an electrical path between a detection node and an inverting input of the comparator, the first diode connected to be reverse biased during a negative half of the alternating current input signal cycle and to remove the electrical path between the detection node and the inverting input of the comparator; and
    a second diode connected to be forward biased during the negative half of the alternating current input signal cycle and to create an electrical path between the detection node and a non-inverting input of the comparator, the second diode connected to be reverse biased during the positive half of the alternating current input signal cycle and to remove the electrical path between the detection node and the non-inverting input of the comparator,
    wherein an output of the comparator is configured to indicate an overcurrent condition in a circuit loop coupled to the detection node.

2. The protection circuit of claim 1, further comprising:
    first and second resistors connected to form a first voltage divider setting a reference for the non-inverting comparator input during the positive half of the alternating current input signal cycle; and
    third and fourth resistors connected to form a second voltage divider setting a reference for the inverting comparator input during the negative half of the alternating current input signal cycle.

3. The protection circuit of claim 2, wherein, during the positive half of an alternating current input signal cycle, the comparator is configured to indicate the overcurrent condition when a voltage on the inverting comparator input exceeds the reference for the non-inverting comparator input and wherein, during the negative half of an alternating current input signal cycle, the comparator is configured to indicate the overcurrent condition when a voltage on the non-inverting comparator input falls below the reference for the inverting comparator input.

4. The protection circuit of claim 2, wherein the first resistor is connected between a power supply voltage and the non-inverting comparator input, the second resistor is connected between the non-inverting comparator input and ground, the third resistor is connected between the power supply voltage and the inverting comparator input, and the fourth resistor is connected between the inverting comparator input and ground.

5. The protection circuit of claim 4, wherein an anode of the second diode is connected to the non-inverting comparator input and a cathode of the second diode is connected to the detection node, and wherein an anode of the first diode is connected to the detection node and a cathode of the first diode is connected to the inverting comparator input.

6. The protection circuit of claim 1, further comprising:
   a third diode connecting the detection node to a power supply voltage, an anode of the third diode connected to the detection node and a cathode of the third diode connected to the power supply voltage; and
   a fourth diode connecting the detection node to ground, an anode of the fourth diode connected to ground and a cathode of the fourth diode connected to the detection node.

7. A circuit including the protection circuit of claim 1, the circuit further comprising:
   an alternating current power supply;
   a resistive load coupled to the alternative current power supply; and
   one or more transistors connected to complete the circuit loop, the circuit loop including the power supply and resistive load, the one or more transistors configured to be controlled based on an output of the comparator, wherein the one or more transistors are configured to conduct during normal operation and to not conduct when the comparator indicates the overcurrent condition.

8. A method of protecting a circuit against an overcurrent condition, comprising:
   forward biasing a first diode during a positive half of an alternating current input signal cycle to create an electrical path between a detection node and an inverting input of a comparator;
   reverse biasing the first diode during a negative half of the alternating current input signal cycle to remove the electrical path between the detection node and the inverting input of the comparator;
   forward biasing a second diode during the negative half of the alternating current input signal cycle to create an electrical path between the detection node and a non-inverting input of the comparator; and
   reverse biasing the second diode during the positive half of the alternating current input signal cycle to remove the electrical path between the detection node and the non-inverting input of the comparator,
   wherein an output of the comparator indicates an overcurrent condition in a circuit loop coupled to the detection node.

9. The method of claim 8, further comprising:
   setting a reference for the non-inverting comparator input during the positive half of the alternating current input signal cycle using first and second resistors connected to form a first voltage divider; and
   setting a reference for the inverting comparator input during the negative half of the alternating current input signal cycle using third and fourth resistors connected to form a second voltage divider.

10. The method of claim 9, wherein, during the positive half of an alternating current input signal cycle, the comparator indicates the overcurrent condition when a voltage on the inverting comparator input exceeds the reference for the non-inverting comparator input and wherein, during the negative half of an alternating current input signal cycle, the comparator indicates the overcurrent condition when a voltage on the non-inverting comparator input falls below the reference for the inverting comparator input.

11. The method of claim 9, wherein the first resistor is connected between a power supply voltage and the non-inverting comparator input, the second resistor is connected between the non-inverting comparator input and ground, the third resistor is connected between the power supply voltage and the inverting comparator input, and the fourth resistor is connected between the inverting comparator input and ground.

12. The method of claim 11, wherein an anode of the second diode is connected to the non-inverting comparator input and a cathode of the second diode is connected to the detection node, and wherein an anode of the first diode is connected to the detection node and a cathode of the first diode is connected to the inverting comparator input.

13. The method of claim 8, further comprising:
   connecting the detection node to a power supply voltage using a third diode, an anode of the third diode connected to the detection node and a cathode of the third diode connected to the power supply voltage; and
   connecting the detection node to ground using a fourth diode, an anode of the fourth diode connected to ground and a cathode of the fourth diode connected to the detection node.

14. The method of claim 8, further comprising:
   controlling one or more transistors completing the circuit loop based on an output of the comparator, the circuit loop including a power supply and a resistive load, wherein the one or more transistors conduct during normal operation and do not conduct when the comparator indicates the overcurrent condition.

15. A protection circuit, comprising:
   a comparator;
   a detection node coupled to a circuit loop;
   a first diode having an anode connected to a non-inverting input of the comparator and a cathode connected to the detection node, the first diode configured to be forward biased during a negative half of an alternating current input signal cycle and to create an electrical path between the non-inverting comparator input and the detection node, the first diode configured to be reverse biased during a positive half of the alternating current input signal cycle and to remove the electrical path between the non-inverting comparator input and the detection node;
   a second diode having an anode connected to the detection node and a cathode connected to an inverting input of the cathode, the second diode configured to be forward biased during the positive half of the alternating current input signal cycle and to create an electrical path between the inverting comparator input and the detection node, the second diode configured to be reverse biased during the negative half of the alternating current input signal cycle and to remove the electrical path between the inverting comparator input and the detection node;

a first voltage divider configured to set a reference voltage for the non-inverting comparator input during the positive half of the alternating current input cycle; and a second voltage divider configured to set a reference voltage for the inverting comparator input during the negative half of the alternating current input cycle, wherein an output of the comparator is configured to indicate an overcurrent condition in the circuit loop during the positive half of the alternating current input signal cycle when a voltage on the inverting comparator input exceeds the reference set by the first voltage divider, and wherein the comparator output is configured to indicate an overcurrent condition in the circuit loop during the negative half of the alternating current input signal cycle when a voltage on the non-inverting comparator input falls below the reference set by the second voltage divider.

16. The protection circuit of claim 15, wherein the first voltage divider comprises a first resistor connected between the non-inverting comparator input and a power supply voltage and a second resistor connected between the non-inverting comparator input and ground and wherein the second voltage divider comprises a third resistor connected between the inverting comparator input and the power supply voltage and a fourth resistor connected between the inverting comparator input and ground, the protection circuit further comprising:

a third diode connecting the detection node to a power supply voltage, an anode of the third diode connected to the detection node and a cathode of the third diode connected to the power supply voltage; and a fourth diode connecting the detection node to ground, an anode of the fourth diode connected to ground and a cathode of the fourth diode connected to the detection node.

17. A circuit including the protection circuit of claim 15, the circuit loop comprising:

an alternating current power supply;

a resistive load coupled to the alternative current power supply; and one or more transistors connected to complete the circuit loop, the one or more transistors configured to be controlled based on an output of the comparator, wherein the one or more transistors are configured to conduct during normal operation and to not conduct when the comparator indicates the overcurrent condition.

18. The circuit of claim 17, further comprising:

control logic connected to the comparator output, the control logic configured to generate signals for controlling the one or more transistors within the circuit loop based on the comparator output.

19. The circuit of claim 17, further comprising:

a detector configured to detect whether the circuit loop is in the positive half of the alternating current input signal cycle or in the negative half of the alternating current input signal cycle.

20. The circuit of claim 17, further comprising:

a resistor connecting the detection node to the circuit loop.

\* \* \* \* \*

UNITED STATES PATENT AND TRADEMARK OFFICE
CERTIFICATE OF CORRECTION

PATENT NO. : 8,248,747 B2  
APPLICATION NO. : 12/627729  
DATED : August 21, 2012  
INVENTOR(S) : Michael James Callahan, Jr.

Page 1 of 1

It is certified that error appears in the above-identified patent and that said Letters Patent is hereby corrected as shown below:

On the title page, item 73 delete Assignee: "STMicroelectronics Co., Inc." and replace with --STMicroelectronics, Inc.--.

Signed and Sealed this  
Twenty-fourth Day of December, 2013

Margaret A. Focarino  
*Commissioner for Patents of the United States Patent and Trademark Office*